(12) United States Patent
Hozoi et al.

(10) Patent No.: US 12,313,657 B2
(45) Date of Patent: May 27, 2025

(54) METHOD AND SYSTEM FOR IMPROVED CURRENT SENSOR (71) Applicant: ABB E-mobility B.V., Delft (NL)

(72) Inventors: Adrian Hozoi, Mannheim (DE); Luca Ghezzi, Gallarate (IT); Gertjan Koolen, Eindhoven (NL); Ulf Embretsen, Nykoping (SE)

(73) Assignee: ABB E-Mobility B.V., Delft (NL)

( * ) Notice: Subject to any disclaimer, the term of this patent is extended or adjusted under 35 U.S.C. 154(b) by 158 days.

(21) Appl. No.: 17/868,986

(22) Filed: Jul. 20, 2022

(65) Prior Publication Data

US 2022/0357367 A1 Nov. 10, 2022

Related U.S. Application Data (63) Continuation of application No. PCT/EP2020/065596, filed on Jun. 5, 2020.

(30) Foreign Application Priority Data

Jan. 21, 2020 (EP) .................................... 20152956

(51) Int. Cl.
G01R 15/20 (2006.01)
G01R 19/00 (2006.01)
G01R 35/00 (2006.01)

(52) U.S. Cl.
CPC ......... *G01R 15/20* (2013.01); *G01R 19/0092* (2013.01); *G01R 35/005* (2013.01)

(58) Field of Classification Search
CPC ... G01R 15/20; G01R 19/0092; G01R 35/005
See application file for complete search history.

(56) References Cited

U.S. PATENT DOCUMENTS

| 3,482,163 | A | | 12/1969 | Peek et al. |
| 3,573,616 | A | | 4/1971 | Kahen |
| 4,047,046 | A | * | 9/1977 | Milberger ............... H01F 13/00 307/413 |
| 6,201,386 | B1 | | 3/2001 | Jones et al. |
| 9,704,637 | B2 | | 7/2017 | van Vroonhoven et al. |
| 2006/0158176 | A1 | | 7/2006 | Preusse et al. |

(Continued)

FOREIGN PATENT DOCUMENTS

| CA | 618580 A | 4/1961 |
| EP | 0271657 A2 | 6/1988 |

(Continued)

OTHER PUBLICATIONS

European Patent Office, International Search Report in International Patent Application No. PCT/EP2020/065596, 5 pp. (Nov. 2, 2020).

(Continued)

*Primary Examiner* — Paresh Patel
(74) *Attorney, Agent, or Firm* — McCarter & English, LLP; Michael M. Gnibus (57) ABSTRACT A calibration method for calibrating a magnetizable core, wherein the magnetizable core is coupled to a magnetic transducer; the method comprising applying a pulse of magnetomotive force to the core such that a distinct value of remanence is produced in the core, wherein the value of remanence in the core depends on a strength of the pulse.

8 Claims, 5 Drawing Sheets

(56) References Cited

U.S. PATENT DOCUMENTS

| | | |
|---|---|---|
| 2010/0181991 A1 | 7/2010 | Roellgen et al. |
| 2015/0016006 A1 | 1/2015 | Van Vroonhoven et al. |

FOREIGN PATENT DOCUMENTS

| | | |
|---|---|---|
| EP | 1879037 A1 | 1/2008 |
| GB | 2228337 A | 8/1990 |
| WO | WO2015/119087 A1 | 3/2017 |

OTHER PUBLICATIONS

European Patent Office, Written Opinion in International Patent Application No. PCT/EP2020/065596, 5 pp. (Nov. 2, 2020).

The Patent Office of the People's Republic of China, Office Action in Chinese Patent Application No. 202080093725.3, 9 pp. (Dec. 16, 2024).

\* cited by examiner

METHOD AND SYSTEM FOR IMPROVED CURRENT SENSOR

CROSS-REFERENCE TO RELATED APPLICATIONS

This patent application claims priority to International Patent Application No. PCT/EP2020/065596, filed on Jun. 5, 2020, and to European Patent Application No. 20152956.7, filed on Jan. 21, 2020, both of which are incorporated herein in their entirety by reference.

FIELD OF THE DISCLOSURE

The present disclosure relates to a calibration method for calibrating a magnetizable core, wherein the magnetizable core is coupled to a magnetic transducer. Furthermore, the disclosure relates to a detecting method for a sensor arrangement. Furthermore, the disclosure relates to a calibration system for calibrating a magnetizable core. Furthermore, the disclosure relates to a sensor system, a sensor calibration system, an electricity meter, an electrical vehicle, and a vehicle charging station.

BACKGROUND OF THE INVENTION

Providing products for sensing magnetic field or electrical current with improved accuracy and competitive cost is an important sales factor. Accurate sensing of DC and AC currents is needed in control applications such as power drives and power conversion. Even better accuracy is necessary for monitoring or metering in AC networks comprising DC current components or in DC applications, for example related to electrical vehicles, data centers, or renewable energy.

It is known to couple a magnetic transducer to a magnetic flux guide, or ferromagnetic core in order to reach higher sensitivity and/or selectivity. That is, the core can be employed to concentrate the magnetic flux reaching the transducer and boost the magnetic flux density and/or to provide some preferred path(s) for the magnetic flux in order to minimize the interaction with undesired sources or directions of magnetic field. The sensor arrangement comprising a magnetic transducer and a ferromagnetic core can be employed to measure a magnetic field or other physical quantity which interacts with the magnetic field, such as the position of a magnet or an electrical current. For example, for measuring an electrical current flowing through a primary conductor the sensor arrangement can be located in the proximity of the conductor and, in particular, the ferromagnetic core may encircle the conductor at least partly.

Various types of magnetic transducers can be employed, such as Hall transducers or miniature fluxgates. The magnetic transducer provides an electrical signal which represents the magnetic field interacting with the sensor arrangement. The sensor arrangement may also comprise electronic circuitry providing signal conditioning functionalities to improve the quality of the signal or of the measurement. Other functionalities, such as power management, control, digitalization, timing, and or interfacing may also be provided. The electronic circuitry may be partly or completely integrated in one circuit, in particular, together with the transducer.

The ferromagnetic core is made from soft magnetic material, characterized in that they are easily magnetized or demagnetized. They feature low coercivity and high permeability and are suitable for guiding or channeling the magnetic flux. For example, the relative permeability of relevant ferromagnetic materials may have some value comprised between 100 and 200 k. Low coercivity and low remanence are usually desired in linear sensing applications to minimize the magnetic hysteresis and to provide reproducible magnetic response of the ferromagnetic material. The magnetic response characterizes the relationship between the magnetic flux density, B, and the magnetic field, H, and can be determined for example from magnetic hysteresis measurements (also known as B-H curves).

The magnetic hysteresis causes remanence of the ferromagnetic core which can be detected by the magnetic transducer of the sensor arrangement and cause a related hysteretic offset error. The hysteretic offset error depends on the history of the magnetic fields experienced by the ferromagnetic core in a non-linear manner and the error cannot be thus predicted or corrected. Certain grades of amorphous alloys, nanocrystalline alloys, or nickel-iron alloys feature low coercivity and low remanence, however, they would still lead to non-negligible hysteretic offset errors. However, nanocrystalline alloys and amorphous alloys are mainly available for tape-wound cores such as toroidal cores, while the pricing of nickel-iron alloys is rather high. Ferromagnetic cores made from nanocrystalline alloys feature attractive combination of good magnetic properties and acceptable cost.

Further, soft magnetic materials are subject to non-linear effects related to the dependence of their magnetic permeability on the magnitude of the magnetic field. This is the case even when the magnetic materials are operated well below their saturation limit. Generally, the value of the initial permeability, which is the permeability measured at weak magnetic field in demagnetized state, e.g. at 0.1 A/m, is smaller than the maximum value of the permeability, which usually occurs at stronger magnetic field having a value greater than the coercivity of the material, Hc. For example, in the case of silicon-iron alloys the maximum permeability can be between 10 to 50 times higher than the initial permeability. Even for most linear magnetic materials, such as specific grades of nanocrystalline alloys or amorphous alloys, it is extremely challenging to guarantee that the difference between the initial permeability and the maximum permeability is less than 20%. Further, the value of the permeability usually depends on the magnetization state of the magnetic core which depends on the hysteresis of the ferromagnetic material and on the operation history of the arrangement. For example, the value of the permeability measured at weak magnetic field, e.g. at 0.1 A/m can be significantly smaller when the ferromagnetic material is in magnetized state as in demagnetized state. This behavior causes hysteretic sensitivity errors which are dependent on the magnetization state of the core.

In practice it is known to provide the sensor arrangement with at least one non-magnetic region into the path of the magnetic flux to be sensed. The magnetic flux to be sensed would be guided through the ferromagnetic core but also through a non-magnetic region, for example air. The non-linear response of the resulting core arrangement is thus significantly reduced because of the linear reluctance of the non-magnetic region and the remanence of the core is reduced because of the self-demagnetization effect caused by the non-magnetic region. The linearity of a sensor arrangement having an open core or gapped core, where the magnetic flux is not completely enclosed in a ferromagnetic core, is thus improved. Similarly, hysteretic sensitivity errors are also improved.

The non-linearity error and the temperature drift of the sensitivity (closed loop gain) of a flux-compensated sensor arrangement are drastically improved by employing flux compensation. Flux compensation allows minimizing the magnitude of the magnetic flux present in the core during normal operation of an ideal sensor arrangement, which is beneficial to reduce magnetization effects in the core and to reduce thus the hysteretic offset error. Unfortunately, multiple situations leading to relatively high values of the magnetic flux in the core or in part of the core are possible in practice. Some situations can be related to abnormal conditions, for example when the magnetic field or magnetomotive force applied to the sensor arrangement exceeds the flux compensation capability because of overload or because the senor arrangement is not powered or is shut down. Large interfering magnetic field(s) of external origin can also cause significant magnetic flux in part(s) of the core. Other situations can be related to construction imperfections, for example when the magnetic flux is not homogenously distributed in the core because of mismatches of the magnetic coupling with the magnetomotive to be sensed and with the compensation magnetomotive force, leading to flux values significantly larger than 0 in part(s) of the core. It is also possible that the flux compensation is less efficient at certain frequencies or in the case of certain transient signals.

In practice, even flux-compensated sensor arrangements are still affected by hysteretic offset errors. The demagnetizing sequence consists of a magnetomotive force excitation with alternating polarity and progressively decaying magnitude, going from a relatively high start value to a vanishing end value. The magnetization state of the core is set by the magnetic flux density experienced by the core during the demagnetizing sequence, especially towards the end of the sequence. A demagnetized state is reached only if no additional magnetic field is interfering with the core during the demagnetizing sequence, whereas an unknown magnetized state is reached even if a weak magnetic field is interfering with the core during the demagnetizing sequence. The outcome of the demagnetizing sequence is thus reliable only if no magnetic field, of external origin or from the physical quantity to be measured, interacts with the sensor arrangement during the demagnetizing process. Demagnetizing is thus not sufficiently reliable for being deployed in practical installations. Furthermore, the demagnetizing sequence needs considerable time to be executed, usually longer than 200 ms.

Sensor arrangements comprising ferromagnetic cores suffer from non-linear errors, hysteretic sensitivity errors, and hysteretic offset errors. The hysteretic sensitivity errors and the hysteretic offset errors depend on the magnetization state of the core can vary depending on the history of the magnetic fields experienced by the core. The magnetic fields may originate from the physical quantity to be measured or from external interfering sources. Solutions known from the art to deal with hysteretic offset errors rely on applying a demagnetizing sequence to the core in order to set the core in a known demagnetized state, where the hysteretic errors are null. However, the outcome of demagnetizing is reliable only if performed in a controlled environment where it can be guaranteed than no magnet field other than the demagnetizing field is acting on the core. This is usually not the case in real operation because of magnetic fields originating from the physical quantity to be measured or from external interfering sources.

Demagnetizing is not an effective and robust method to ensure low hysteretic sensitivity errors and hysteretic offset errors. The hysteretic sensitivity error is reduced to a considerable extent by employing a non-magnetic region into the path of the magnetic flux to be sensed and/or by operating in flux-compensated mode. However, the hysteretic offset error cannot be effectively addressed and is presently a serious limitation in related sensor arrangements for measuring magnetic field or electrical current.

CA 618580 A refers to a closed loop current sensor with Hall effect transducer. U.S. Pat. No. 3,573,616 A refers to a closed loop current sensor with Hall effect transducer. U.S. Pat. No. 3,482,163 A refers to a closed loop current sensor with demagnetizing sequence, where demagnetizing signal is a damped oscillation. U.S. Pat. No. 9,704,637 B2 refers to a closed loop current sensor with demagnetizing sequence, where demagnetizing signal is a plurality of pulses with alternating polarity. EP 0 271 657 A2 refers to a nanocrystalline alloy. It is known from the prior art, e.g. U.S. Pat. Nos. 3,482,163 A and 9,704,637 B2, to demagnetise the magnetic core by applying a signal to the secondary winding in order to reduce the remanent magnetisation of the core and consequently the magnetic offset error of the sensor. The demagnetising signal must produce in the core a sequence where the magnetic field features alternating polarities and progressively decaying magnitude towards 0. The result of the sequence is unreliable if some finite magnetic field is simultaneously produced in the core. Demagnetising can thus be applied only if the primary circuit is free of any current and if no magnetic field of external origin is exerted. Furthermore, the demagnetising sequence is relatively complex and needs considerable execution time.

BRIEF SUMMARY OF THE INVENTION

The present disclosure relates to a sensor arrangement employing a magnetic transducer coupled to a magnetic flux guide, or ferromagnetic core, in order to measure a physical quantity interacting with the sensor arrangement via magnetic field. The physical quantity to be measured can be a magnetic field, a magnetomotive force, or any physical quantity interacting with the magnetic field. The sensor arrangement may be provided with means to apply a compensation current in a compensation winding in order to cancel or almost cancel the magnetic flux in the ferromagnetic core. For example, the sensor arrangement can be installed to interact with the magnetomotive force produced by a current flowing in a primary conductor, such that a measurement of the primary current is provided. In particular, the sensor arrangement is a flux-compensated current sensor where the primary conductor is magnetically coupled to the core and the compensation current is proportional to the primary current. Flux-compensated current sensors can measure AC and DC currents with large nominal value, for example in the order of 10 A or up to 10000 A, over wide frequency bandwidth, for example from DC to 10 kHz or up to 500 kHz.

The present disclosure further relates to electricity meters comprising a current sensor as described above.

The present disclosure also relates to electrical vehicles and/or to charging stations comprising a meter or a current sensor as described above. Electrical vehicles are understood here in a broad scope and include, without being limited to, road and rail vehicles, surface and underwater vessels, aircraft and spacecraft comprising electrical means for propulsion. Charging stations deliver electric energy for the recharging of electrical vehicles or of battery packs like those employed in electrical vehicles. In particular cases, charging stations may also be employed for the discharging of electrical vehicles or of battery packs.

DETAILED DESCRIPTION OF THE INVENTION

Figure 1A:
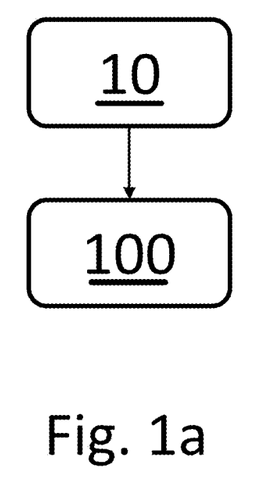
FIG. 1a shows a flow chart of a calibration method according to an embodiment of the present disclosure.

FIG. 1a shows a flow chart of a calibrating/calibration method according to an embodiment of the disclosure. According to a step indicated by reference number "10", the method comprises determining a change of state of a sensor arrangement, and according to a step indicated by reference number "100", the method comprises applying a pulse of magnetomotive force to the core.

Figure 1B:
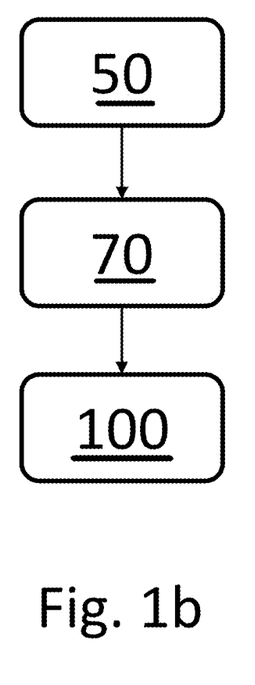
FIG. 1b shows a flow chart of a calibration method according to another embodiment of the present disclosure.

FIG. 1b shows a flow chart of a calibrating/calibration method according to another embodiment of the disclosure. According to a step indicated by reference number "50", the method comprises selecting the polarity of the pulse of magnetomotive force to be applied to the core. According to a step indicated by reference number "70", the method comprises storing the polarity of the pulse of magnetomotive force. According to a step indicated by reference number "100", the method comprises applying a pulse of magnetomotive force to the core such that a distinct value of remanence is produced in the core, wherein the value of remanence in the core depends on a strength of the pulse.

Figure 1C:
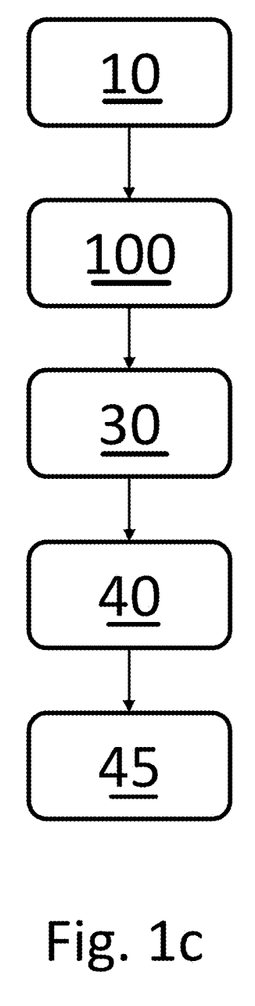
FIG. 1c shows a flow chart of a calibration method according to another embodiment of the present disclosure.

FIG. 1c shows a flow chart of a calibrating/calibration method according to another embodiment of the disclosure. According to a step indicated by reference number "10", the method comprises determining a change of state of a sensor arrangement, and according to the step indicated by reference number "100", the method comprises applying a pulse of magnetomotive force to the core. According to a step indicated by reference number "30", the method comprises providing a measurement signal, by the sensor arrangement. According to a step indicated by reference number "40", the method comprises determining a correction quantity, e.g. by evaluating the measurement signal using external equipment and/or means in the sensor arrangement. According to a step indicated by reference number "45", the method comprises storing the correction quantity.

According to another embodiment (not shown), the previously described method comprises a step of selecting the polarity of the pulse of magnetomotive force to be applied to the core, indicated by reference number "50" (see also FIG. 1b). A correction quantity is stored in the step indicated by the reference number "45", wherein the correction quantity is preferably stored in a categorized manner, for example based on the polarity of the pulse of magnetomotive force applied to the core.

According to another embodiment (not shown), the method from the previous embodiment is executed at least once for each different polarity of the pulse of magnetomotive force being applied to the core and multiple correction quantities are stored in a categorized manner, depending on the polarity of the said pulse and/or on other calibration conditions such as temperature. Storing of the correction quantities may be performed in multiple steps or combined in at least one step.

According to another embodiment (not shown), the method comprises a combination of the steps "40", "45" and "100": According to the step indicated by reference number "40", the method comprises determining a correction quantity, e.g. by design calculations or type tests. According to the step indicated by reference number "45", the method comprises storing the correction quantity. Finally, according to the step indicated by reference number "100", the method comprises applying a pulse of magnetomotive force to the core.

Figure 2A:
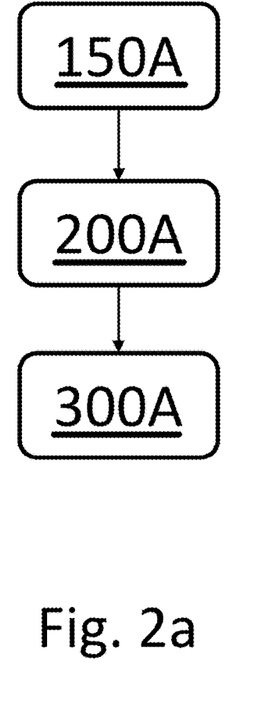
FIG. 2a shows a flow chart of a detecting method according to an embodiment of the present disclosure.

FIG. 2a shows a flow chart of a detecting method for a sensor arrangement comprising a core and a magnetic transducer.

According to a step indicated by reference number "150A", the method comprises detecting, by a magnetic transducer coupled to a magnetizable core, a magnetic field. According to a step indicated by reference number "200A", the method comprises producing a measurement signal, by the sensor arrangement, in accordance with a physical quantity to be measured, wherein the physical quantity interacts via a magnetic field with the core and with the transducer. According to a step indicated by reference number "300A", the method comprises correcting the measurement signal by a correction quantity, where preferably the correction quantity is determined according to a calibration method according to the invention. Preferably, the method steps "150A", "200A", and "300A" are executed simultaneously or partially simultaneously.

Figure 2B:
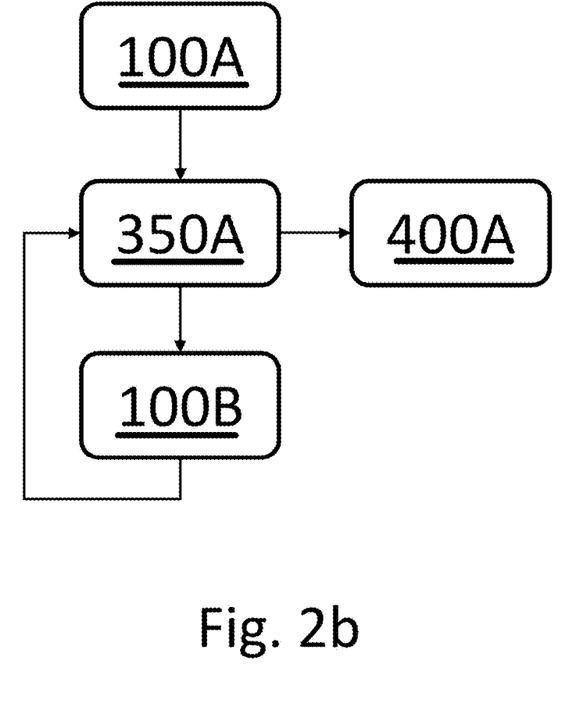
FIG. 2b shows a flow chart of a detecting method according to another embodiment of the present disclosure.

FIG. 2b shows a flow chart of a detecting method according to another embodiment. According to a step indicated by reference number "100A", the method comprises calibrating a core of a sensor arrangement according to a calibration method of the invention. For example, the step "100A" can comprise the calibration method steps according to the method of FIG. 1c. According to a step indicated by reference number "350A", the method comprises detecting, by a magnetic transducer, a magnetic field and producing and correcting a measurement signal, by a sensor arrangement, in accordance with a physical quantity to be measured, wherein the physical quantity interacts via a magnetic field with the core and with the transducer. For example, the step "350A" can comprise the method steps according to the method of FIG. 2a. According to a step indicated by reference number "100B", the method comprises calibrating the core of the sensor arrangement according to a calibration method of the invention. For example, the step "100B" can comprise calibration method steps according to the method of FIG. 1a. According to a step indicated by reference number "400A", the method comprises providing a corrected measurement signal. Preferably, the method steps "350A" and "400A" are executed simultaneously or partially simultaneously. For example, it is also possible to execute the step "400A" simultaneously with the step "100B", in which case it is convenient to minimize the duration of the step "100B" because the measurement signal of the sensor arrangement is disrupted during this step. The short duration of the pulse employed to calibrate the core according to the invention is beneficial for maximizing the availability of the measurement signal. Additionally, the method may comprise a step (not shown) of processing the measurement signal to compensate for the disruption caused by step "100B" and, in particular, to provide a continuous measurement signal.

Figure 2C:
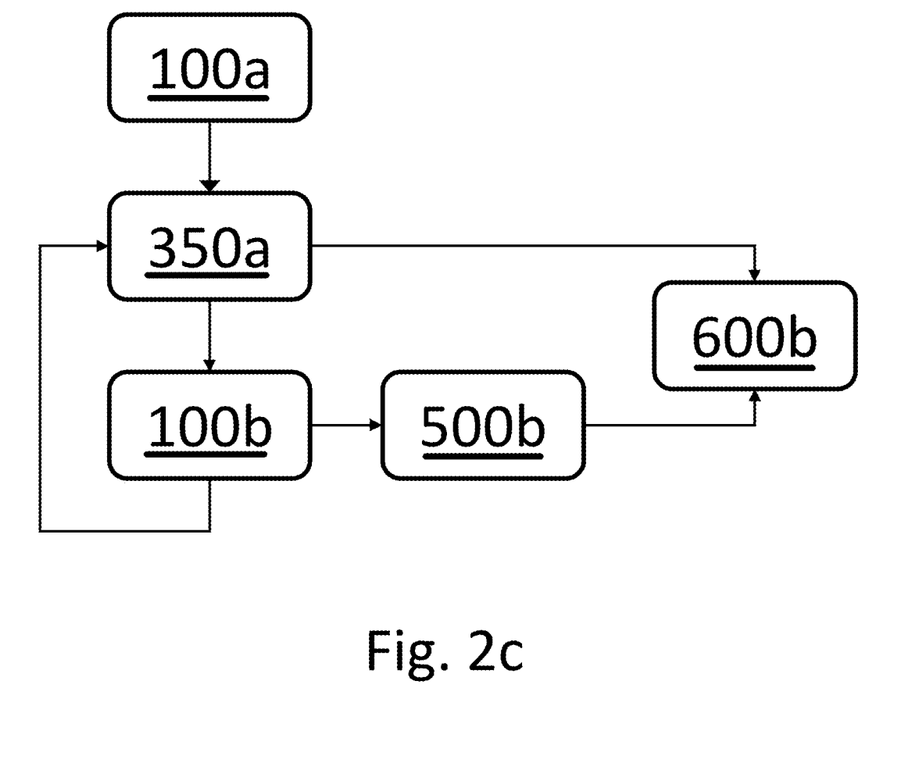
FIG. 2c shows a flow chart of a detecting method according to an embodiment of the present disclosure.

FIG. 2c shows a flow chart of a detecting method according to an embodiment. According to a step indicated by reference number "100a", the method comprises calibrating a core of a sensor arrangement according to a calibration method of the invention. According to a step indicated by reference number "350a", the method comprises detecting, by a magnetic transducer, a magnetic field and producing and correcting a measurement signal, by a sensor arrangement, in accordance with a physical quantity to be measured, wherein the physical quantity interacts via a magnetic field with the core and with the transducer. According to a step indicated by reference number "100b", the method comprises calibrating the core of the sensor arrangement according to a calibration method of the invention. According to a step indicated by reference number "500b", the method comprises employing a supplementary sensor module, configured to measure the same physical quantity as the sensor arrangement, to provide a functional measuring signal while the core of the sensor arrangement is being calibrated. The benefit of the method is the following: the step "500b" ensures that a measuring signal is available from the supplementary sensor module during a period of the step "100b" when the measurement signal from the sensor arrangement is not available or disrupted by the step "100b". In this way, a measurement of the physical quantity to be measured is always available and the step "100b" of calibrating the core of the sensor arrangement can be executed whenever is necessary for ensuring very high accuracy. The method is thus very robust and accurate. The step "500b" is executing simultaneously to the step "100b" at least during the time interval when a pulse of magnetomotive force is being applied to calibrate the core. Furthermore, for example, it is also possible that the step "500b" is executing simultaneously to the step "350b" to provide additional functionality such as redundancy, or monitoring, or further enhanced accuracy. Preferably, according to a step indicated by reference number "600b", the method comprises employing an electronic circuitry to select and process the signals from the sensor arrangement and from the supplementary sensor module.

According to another embodiment (not shown), any detecting method previously described comprises a step of retrieving the polarity of the latest pulse of magnetomotive force applied to the core and a step of retrieving the correction quantity corresponding to the said polarity. Alternatively, retrieving the polarity of the latest pulse and retrieving the correction quantity corresponding to the said polarity may be comprised in a step comprising correcting the measurement signal by a correction quantity (for example "300A", "350A", "350a").

The core of a sensor arrangement is set in a preferred magnetised state by a calibration method according to the disclosure. Compared to demagnetising, a calibration method according to the invention is significantly faster and it is more reliable because it can be applied in the presence of various magnetic fields. The stability of the sensor arrangement is greatly enhanced when consistently operated with the core in a preferred magnetised state, where errors caused by drifts of the remanent magnetization are practically eliminated. A detecting method according to the disclosure provides a way to correct the offset caused by the preferred magnetised state and allows to further improve the accuracy. Furthermore, the detecting method is versatile and provides multiple possibilities to be combined with the calibration method in order to provide robust and accurate solutions. The magnetised state is particularly stable if flux compensation is employed, as for example in closed-loop current sensors. Results of tests performed by the inventors with a closed-loop current sensor confirmed that accuracy improvements up to around 10 times are achieved when operating according to the invention as compared to operating according to known art, for example using demagnetising. Furthermore, a solution according to the invention is flexible and can be implemented in various configurations, with moderate complexity and competitive cost. Several implementation possibilities are exemplified further with a focus on closed-loop current sensors.

Figure 3:
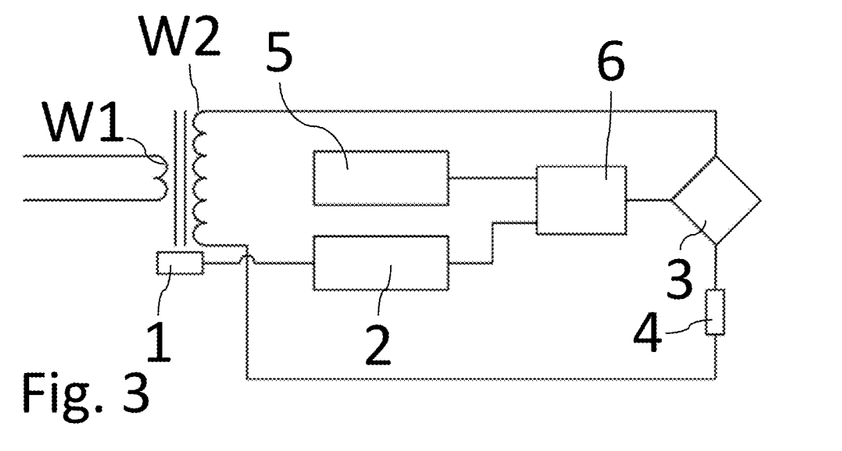
FIG. 3 shows a closed-loop current sensor according to a first embodiment of the sensor system in accordance with the disclosure.

For example, it is possible to apply a magnetising signal to the secondary winding by sharing the driver and the winding employed for the compensation current. FIG. 3 shows an embodiment applying such principle. FIG. 3 shows a closed-loop current sensor according to a first embodiment of a sensor system according to the invention. The sensor comprises a ferromagnetic core, a magnetic transducer 1, a signal conditioner 2, a driver 3, a resistor 4, a magnetizing controller 5, and a selector 6. Further, there are provided a primary winding W1 and a secondary winding W2.

The magnetic transducer 1 is coupled to sense the magnetic flux density in the ferromagnetic core. The transducer 1 is connected to the signal conditioner 2 which is coupled to the driver 3 to force a compensation current in the secondary winding W2 in order to cancel the magnetic flux produced by the current flowing in the primary winding W1. The resistor 4 is a measurement resistor for a secondary current, in particular for measuring the compensation current.

The magnetizing controller 5 is connected to the selector 6 to select a magnetising signal or a compensation signal to be provided to the driver 3 in order to apply a corresponding current to the secondary winding W2. The same driver 3 is beneficially employed to provide a magnetising current or a compensation current to the same secondary winding W2. The selector comprises means to switch or to select signals or to select parts of a circuitry, for example switches, enable or disable functions, or overriding signals.

Figure 4:
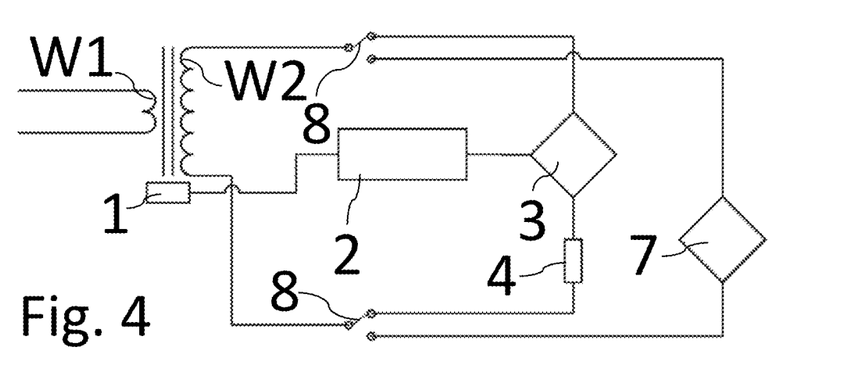
FIG. 4 shows a closed-loop current sensor according to a second embodiment of the sensor system in accordance with the disclosure.

According to another example, it is possible to switch the connection of the secondary winding between the compensation driver and a dedicated magnetiser driver. FIG. 4 shows an embodiment applying such principle. FIG. 4 shows a closed-loop current sensor according to a second embodiment of the sensor system according to the invention. This system is a closed-loop current sensor comprising a secondary winding W2 and a selector to connect the winding in a selectable manner to a driver 3, for compensation, or to a magnetiser driver 7. The selector comprises switching means 8, for example. The switching means 8 can be based on discrete semiconductor components or on IC(s), however, electromagnetic switches are also possible.

Figure 5:
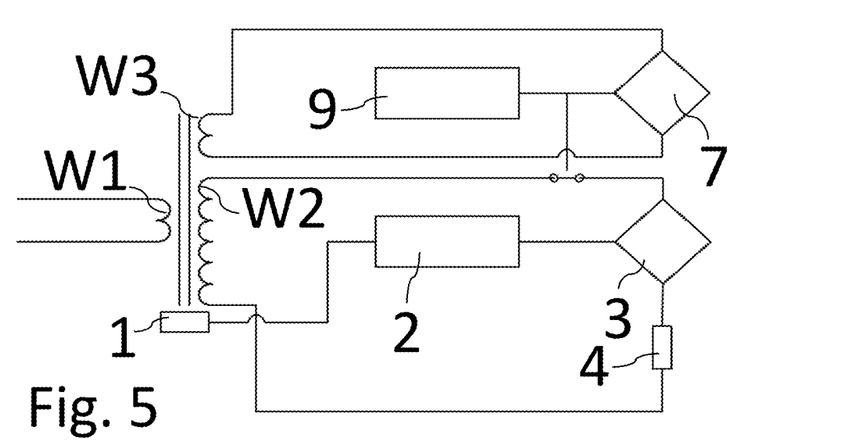
FIG. 5 shows a closed-loop current sensor according to a third embodiment of the sensor system in accordance with the disclosure.

It is also possible to employ an auxiliary winding for applying the magnetising signal to the core. FIG. 5 shows an embodiment applying such principle. The auxiliary winding can be optimized for low inductance in order to enable very fast magnetising pulses and the magnetiser driver can be very simple, e.g. based on one transistor or on a bridge arrangement. If an auxiliary winding is employed, it is beneficial to force the compensation current in the same direction as the magnetising pulse or to interrupt the secondary circuit during magnetising.

FIG. 5 shows a closed-loop current sensor according to a third embodiment of the sensor system according to the disclosure. In this embodiment, the sensor system comprises a secondary winding W2 connected to a driver 3, for compensation, and an auxiliary winding W3 connected to a magnetiser driver 7. The controller 9 can select the driver to be activated and/or open the circuit of the secondary winding W2 during the generation of a magnetising pulse, for example using a selector.

Figure 6:
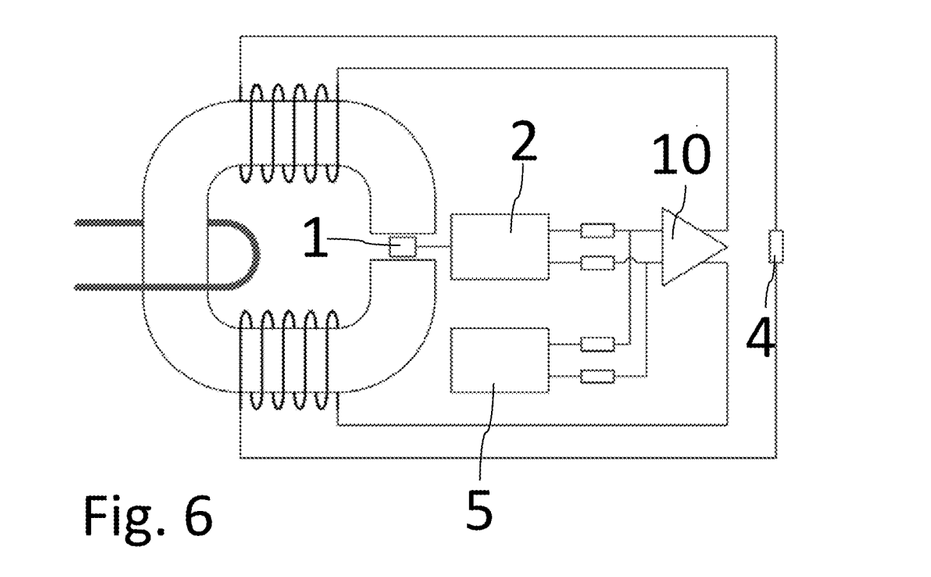
FIG. 6 shows a closed-loop current sensor according to a fourth embodiment of the sensor system in accordance with the disclosure.

FIG. 6 shows a closed-loop current sensor according to a fourth embodiment of the sensor system according to the disclosure. This system is a closed-loop current sensor where the magnetising signal overrides the compensation signal. The sensor features a differential driver and a secondary winding which is split in two balanced parts, where the measuring resistor is connected in the middle in order to reduce the excursion of its common mode voltage. The magnetic transducer 1 is for example a Hall type transducer and it is in a gap of the ferromagnetic core.

Figure 7:
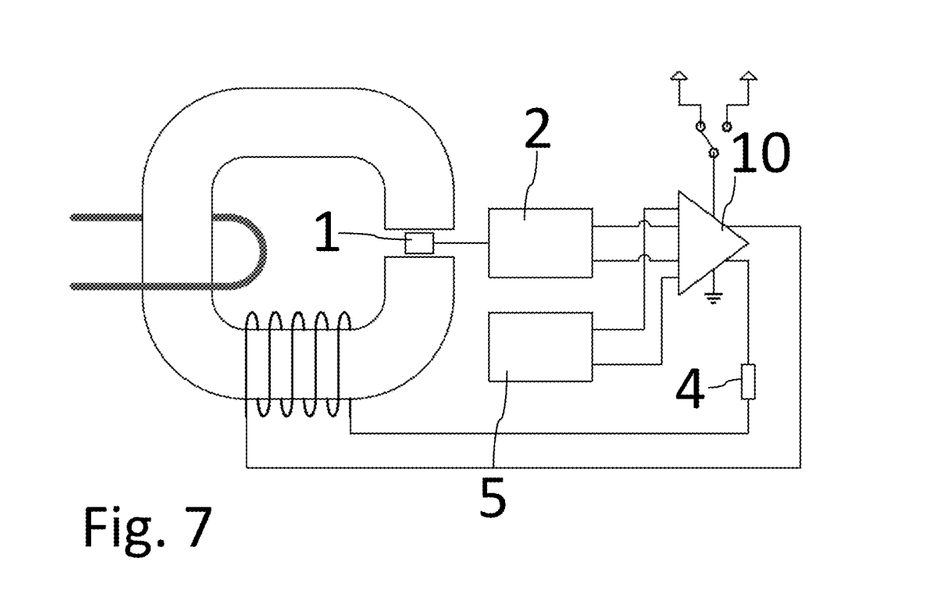
FIG. 7 shows a closed-loop current sensor according to a fifth embodiment of the sensor system in accordance with the disclosure.

FIG. 7 shows a closed-loop current sensor according to a fifth embodiment of the sensor system according to the disclosure. The system is a closed-loop current sensor comprising means to magnetise the core and to temporarily increase the supply voltage of the driver, e.g. during magnetising.

In the case of a shared driver, it is convenient to provide it with a supply voltage which can be increased when the magnetising pulse is produced (FIG. 7) in order to boost the speed and the magnitude of the magnetising pulse. The supply voltage can be lower while providing a compensation current in order to ensure low power dissipation.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

In one aspect, the disclosure describes an improved current sensor. In particular, it is an aspect of the disclosure to minimize the hysteretic offset error of a sensor arrangement comprising a magnetic transducer coupled to a magnetizable core, such as a ferromagnetic core.

A calibration method for calibrating a magnetizable core is described, wherein the magnetizable core is coupled to a magnetic transducer. The method comprises applying a pulse of magnetomotive force to the core to produce a distinct value of remanence in the core, wherein the value of remanence in the core depends on a strength of the pulse. Preferably, a distinct value of the remanence is produced in the core which mainly depends on the strength of the pulse.

There is no need to be mentioned that after having quantified, with the correction quantity, the state of remanent magnetization in the core, the previously described method may comprise a step of storing, by storing means, the quantity.

Furthermore, a detecting method for a sensor arrangement comprising the core and the magnetic transducer is described. The method comprises detecting, by the magnetic transducer, a magnetic field; producing a measurement signal, by the sensor arrangement, in accordance with a physical quantity to be measured, wherein the physical quantity interacts via a magnetic field with the core and with the magnetic transducer; correcting the measurement signal by a correction quantity, wherein the core is configured by the calibration method of the preferred embodiments described below.

Furthermore, the core may be any arrangement being able to interact with the magnetic field, such as a magnetic flux guide or a ferromagnetic core. The ferromagnetic core is preferably made predominantly of a soft magnetic material of ferromagnetic type or of a similar type. The physical quantity to be measured can be a magnetic field, a magnetomotive force, or any physical quantity interacting with the magnetic field.

Furthermore, a calibration system for calibrating a magnetizable core is described, wherein the magnetizable core is coupled to a magnetic transducer, wherein the system is configured to apply a pulse of magnetomotive force to the core to calibrate the core according the method steps according to the invention or according to any of the preferred embodiments.

Furthermore, a sensor system comprising a sensor arrangement provided with a magnetizable core and a magnetic transducer being coupled to the core, wherein the core is configured by the calibration system, is described.

Furthermore, a sensor calibration system comprising the calibration system and/or the sensor system is described.

Furthermore, an electricity meter comprising the calibration system and/or comprising the sensor system and/or comprising the sensor calibration system is described.

Furthermore, an electrical vehicle or charging station, comprising the calibration system and/or comprising the sensor system and/or comprising the sensor calibration system and/or comprising the electricity meter, is described.

According to the disclosure, calibration and detecting methods for improving current sensors are provided. For improving current sensors, it is a key point to set the remanent magnetization of the magnetizable core coupled to the transducer to a preferred value in a manner which is time efficient and reproducible and where the preferred value is stable and its effect on the measurement signal can be corrected. Possible drifts of the remanent magnetization, which may occur during the lifetime of the sensor, can be eliminated by setting or reinitializing the preferred value of the remanent magnetization. This is achieved by applying a pulse of magnetomotive force, which preferably is a magnetizing pulse featuring sufficiently high magnitude in order to be robust and preferably a simple shape in order to be easy to implement and fast to execute.

The embodiments described herein can provide drastically improved accuracy, measurement error of DC signals up to around 10 times lower compared to solutions without correction of hysteretic offset errors. Furthermore, fast setting of the preferred magnetized state is possible. The magnetizing pulse is significantly shorter than a demagnetizing sequence. Moreover, the outcome of the magnetizing pulse is reproducible and relatively immune against disturbing influences and tolerances. The outcome of a demagnetizing sequence is easily influenced by disturbing magnetic influences. In addition, the magnetizing pulse solution has limited complexity, simpler than demagnetizing. Additionally, the solution is convenient to integrate in flux-compensated sensors and complements the benefits of flux compensation achieved under normal operation by effectively addressing the hysteretic offset drifts caused in abnormal operation. Furthermore, the solution is easy to implement in applications where the field or the magnetomotive force to be sensed feature a predictable dominant direction, which can be conveniently employed to preserve the preferred magnetized state.

The easy implementation of the method and the excellent DC accuracy, which can be ensured by the drastic reduction of offset errors allow providing a superior flux-compensated current sensor solution to be employed in electrical equipment involving accurate DC measurement, such as electricity meters for DC applications.

To sum up, the disclosure describes embodiments in which magnetizing the core of the sensor arrangement to set a preferred magnetized state characterized by a distinct preferred remanent magnetization. The core is magnetized by applying a pulse of magnetomotive force, for example by sending an electrical current through a conductor or winding which is magnetically coupled to the core. Preferably, the preferred magnetized state mainly depends on the peak value reached by the magnetizing magnetomotive force, which is beneficial for employing a simple shape and a short duration of the magnetizing pulse. The preferred remanent magnetization causes a preferred remanent offset of the measurement signal provided by the sensor arrangement. The sensor arrangement or the connected equipment is provided with means to correct, e.g. subtract, the preferred remanent offset from the measurement signal. The preferred remanent offset is quantified and stored in order to be employed for correcting the measurement signal from the sensor arrangement.

The value of the preferred remanent offset can be determined by design calculations or it can be measured during a calibration procedure, employing means internal and/or external to the sensor arrangement. The value of the preferred remanent offset can be stored or encoded in a component, provided in or with the sensor arrangement, such as a programmable electronic component, an adjustable resistor, a trimmable resistor, a label, or a calibration certificate. The preferred remanent offset can be subtracted from the measurement signal employing analog and/or digital electronic circuitry included in the sensor arrangement or in the equipment connected to the sensor arrangement. During measurement operation of the sensor arrangement, the preferred remanent offset value is subtracted from the measurement signal to provide a corrected measurement signal featuring negligible hysteretic offset error.

A magnetic transducer is a device that converts magnetic energy or a magnetic signal to another form of energy or signal. A sensor is a device, or an arrangement of devices, or a system that receives and responds to a signal or stimulus from a physical environment. It produces a signal, which represents information about a physical quantity in the environment. The physical quantity is, in the present case, a physical quantity interacting via a magnetic field with a magnetizable core, which is, for example, a ferromagnetic core. The previously described sensor may be a current sensor, in which case the physical quantity interacting with the magnetizable core is an electrical current.

Compared to demagnetizing, the magnetizing calibration solution can be significantly faster executed, more versatile, robust, and reproducible but also slightly easier to implement. Excellent accuracy can be inherently ensured in applications where the core experiences during measurement operation a magnetic field oriented along a dominant direction, which corresponds to the magnetizing direction. The benefits of the solution can be easily extended to cope with any direction of the magnetic field, especially when a flux-compensated sensor arrangement is employed. Very low drift of the remanent magnetization can be ensured during normal operation by operating under predominantly 0 flux, while eventual drifts caused by abnormal conditions can be effectively reset by reinitializing the preferred remanent magnetization.

A flux-compensated current sensor according to the disclosure can be implemented with moderate additional complexity compared to a traditional flux compensated current sensor, for example by upgrading the control and the driver circuitry. The solution is thus economically competitive while the DC accuracy can be drastically improved by almost eliminating the hysteretic offset errors. Reducing the hysteretic offset errors by a factor of 10 or higher is possible. The much better DC accuracy ensured by the solution also allows extending the measuring range of the sensor towards smaller currents.

The solution according to the disclosure provides basically unlimited overload withstand capability, as the measurement accuracy can be recovered rapidly and reproducibly even from strong overloads. For example, a magnetizing pulse can be applied after the overload or even during the overload. In particular, the energy present in an overload can be conveniently employed to set the magnetized state.

A flux-compensated current sensor solution according to the invention can be beneficially employed for measuring DC currents with accuracy up to around 10 times better than solutions known from the art having similar size and cost. At high DC currents, e.g. larger than 100 A, similar or better accuracy had been previously possible only with flux-compensated current sensors employing toroidal fluxgates, which feature significantly larger size, higher power dissipation, and much higher cost.

The flux-compensated current sensor according to the disclosure provides unprecedent combination of excellent accuracy, wide measurement range, capability to withstand strong overloads, low cost, and small size for DC and AC applications. The solution is thus particularly suitable to be employed in electricity meters, which would largely benefit from all these features. An accurate, compact, and low-cost DC meter or AC/DC meter is very attractive for being installed in electric vehicles or in charging stations. The meter or the current sensor is attractive in other applications related to generation or distribution/delivery of electrical energy, for example in data centres or in renewable energy systems. The current sensor is also suitable for industrial or scientific applications where precise monitoring or control of electrical current, including DC, is needed.

The remanence of the core may depend, in addition to the strength of the pulse, for example, on a core material, and on a construction and geometry of the core. The latter may influence for example the remanent magnetization of the core through self-demagnetization.

In the context of this application, the saturation remanent magnetization is considered as the remanent magnetization of the core achieved after applying a magnetizing magnetomotive force characterized in that doubling the value of the magnetomotive force would cause a change of the remanent magnetization which is smaller than 10%. The remanent offset of the sensor arrangement is proportional to the remanent magnetization of the core and the considerations above can be reflected in a similar manner to the remanent offset. A saturation remanent offset can be used for example to describe the effect of the saturation remanent magnetization of the core.

According to a preferred embodiment, a duration and the strength of the pulse produces a magnetization of the core induced by the pulse that is robust against a magnetic field with a strength below a magnetic field strength threshold. The preferred magnetized state is selected such that it is stable against magnetic fields experienced by the core during measurement operation.

In other words, the preferred magnetized state is selected such that it can be set during calibration in a reproducible manner even in the presence of magnetic fields coming from other sources than from the magnetizing magnetomotive force. This is achieved by providing a magnetizing magnetomotive force having a peak value which is sufficiently high in order to approach or reach magnetic saturation in the core. The effect can be twofold: The relative effect of a disturbing field on the magnetomotive force is reduced if the magnetomotive force has high magnitude and the variation of the magnetic flux density with the magnetomotive force drops significantly as saturation is approached. The second effect is actually very strong because the rate of change of the magnetic flux density with the applied magnetomotive force drops sharply as it approaches saturation.

According to a preferred embodiment, the duration and the strength of the pulse produces a magnetization of the core induced by the pulse with a remanent magnetization, which is larger than 50% of a saturation remanent magnetization of the core. In other words, a preferred remanent magnetization is produced which is larger than 50% of the saturation remanent magnetization of the core. Such measure may be advantageous in applications, in which moderate to high values of magnetic flux density may be reached in the core during operation or because of other conditions such as overload.

According to a preferred embodiment, the duration and the strength of the pulse produces a magnetization of the core induced by the pulse with a remanent magnetization, which is larger than 80% of a saturation remanent magnetization of the core. In other words, it is employed a relatively strong magnetizing magnetomotive force and a preferred remanent magnetization which is larger than 80% of the saturation remanent magnetization of the core. Such measure may be advantageous in applications, in which the sensor arrangement is intended for operation in harsh environments with strong overloads and interfering fields.

If the preferred remanent magnetization is closer to the saturation remanent magnetization, it is possible to set or to reinitialize the magnetized state precisely and reproducibly because the value of the remanent magnetization is less sensitive to possible variations of the magnetizing field. This can ensure large margins for tolerances and makes the solution robust even in the presence of magnetic fields coming from other sources than from the magnetizing magnetomotive force. Reproducible performance can be ensured even in harsh environments if the preferred remanent magnetization is larger than 80% of the saturation remanent magnetization of the core.

According to a preferred embodiment, the duration of the pulse matches or exceeds a critical time to reach a desired peak value of the magnetizing magnetomotive force, preferably the duration of the pulse is in a range from 0.01 ms to 200 ms. That means that a calibration procedure can be quickly realized. The critical time mainly depends on the time constant of the electrical winding and on the voltage available to energize the winding during magnetizing. Increasing the voltage and/or reducing the time constant allows shorter pulse duration. Eddy currents produced in the core by the magnetizing pulse may also impact the critical time to reach the desired peak value of the net magnetizing magnetomotive force, especially for very short pulses.

According to a preferred embodiment, the pulse is applied to the core after a change of a state of a sensor arrangement comprising the core and the magnetic transducer is determined. More preferably, the change of the state is given by a power-up of the sensor arrangement and/or is indicated by a state signal. Alternatively, or additionally, the state signal indicates a status of a charging session of a charging station.

The change of state is any change which can affect the operation of the sensor arrangement, in particular where the change is related to a change of an operation mode or task of the of the sensor arrangement or to a change of a remanent magnetization state of the core of the sensor arrangement. For example, the change of state can be related to a change of a power state of the sensor arrangement, to a change of a measurement task involving the sensor arrangement, or to a change of a magnetic field exerted on at least a part of the sensor arrangement that is prone to cause a change of a remanent magnetization state of the core. The change of state can also be given by the end of a time interval, for example from a previous execution of a core calibration or magnetizing pulse. The change of state is determined by the sensor arrangement or by an electrical equipment to which the sensor arrangement is connected. For example, the change of the power state can be given by a power-up or a resuming from a low power mode of the sensor arrangement or of some part of the sensor arrangement. The change of a measurement task can be related to the start or to the end of a measurement session or to an idle period of time during a measurement session. The change of the remanent magnetization state of the core can be caused by magnetic fields interacting with the core during normal or abnormal operation. For example, the change of a remanent magnetization of the core can be determined by analyzing the measurement signal from the sensor arrangement to identify a drift of the remanent magnetization or a condition susceptible to cause a drift of the remanent magnetization such as an overload or a strong transient. The change of a magnetic field exerted on at least a part of the sensor arrangement can be determined by measuring the magnetic field in the sensor arrangement or in the vicinity of the sensor arrangement.

In other words, the pulse can be applied to the core after having detected an adverse condition susceptible to cause a drift of the remanent magnetization, such as overload or strong interfering fields. For example, adverse conditions or a drift caused by adverse conditions can be detected based on analysing the measurement signal and its history. It is also possible to provide the sensor arrangement with additional sensing means to detect adverse conditions such as large interfering magnetic fields or tampering.

The pulse may be applied to the core after having detected a condition favourable to applying the magnetizing pulse.

For example, in applications with idle times the sensor arrangement can decide or can be instructed to run a magnetizing pulse to reinitialize the preferred remanent magnetization and minimize the likelihood of a magnetic offset drift. Because the magnetizing pulse is short, even short idle times can be employed to reinitialize the preferred remanent magnetization.

The pulse is preferably applied to the core after a measurement session has been completed, or initialized, or interrupted. For example, an electrical equipment or a charging station employing the sensor can be provided with means to indicate to the current sensor the status of a measurement or a charging session. For example, a signal or a message may be provided after the end of a measurement or of a charging session, or an initialization instruction may be provided before the start of a measurement or of a charging session. Preferably, a minimum known time shall be observed between the initialization command and the start of the session. A digital interface may be used for messaging between the meter and other electrical equipment, for example charging station.

According to a preferred embodiment, a change of the state is given by a power-up of the sensor arrangement and/or is indicated by a state signal. For example, the state signal can be a power signal supplying the sensor arrangement or part of its circuitry with electrical power or it can be a control signal employed to control a power state of the sensor arrangement or of a part of its circuitry. In another example, the state signal can be a control signal employed to provide an instruction or a status information to the sensor arrangement or to part of its circuitry. The state signal can be an electrical signal or a digital message. Possible implementation examples are applying the pulse on power-up or following an instruction to indicate the start of a measurement session, or an instruction to indicate the end of a measurement session, or an instruction to execute calibration on demand.

According to a preferred embodiment, the state signal depends on a status of a charging session of a charging station. In particular, the state signal provides information to the sensor arrangement about the start, or the completion, or the interruption of a measurement session. For example, in bidirectional charging stations, the state signal can also provide information about the direction of the primary current. Bidirectional charging stations can be employed to charge or to discharge an electric vehicle and the primary current flows in one direction during charging or in opposite direction during discharging.

According to a preferred embodiment, the method comprises selecting the polarity of the pulse of magnetomotive force to be applied to the core and preferably storing the polarity of the pulse of magnetomotive force. According to a preferred embodiment, the pulse of magnetomotive force is applied to the core according to the selected polarity. The magnetizing pulse may have selectable polarity to provide a preferred remanent magnetization having selectable polarity, e.g. positive or negative. That is, the sensor arrangement features a suitable magnetizer driver and interface to allow generating a magnetizing pulse with selectable polarity. Further, the polarity of at least the last magnetizing pulse is stored in the sensor arrangement or in the connected equipment in order to correct the preferred remanent offset from the measurement signal. The magnitude of the preferred remanent magnetization and of the corresponding preferred remanent offset is the same for either polarity and is recorded at calibration. Employing a magnetizing pulse with selectable polarity can provide the benefit to allow matching the direction of the preferred remanent magnetization and of the magnetic field or magnetomotive force to be measured. If prior knowledge exists about a dominant direction of the magnetic field or magnetomotive force to be measured prior to a measurement session, the sensor arrangement can be instructed to set a preferred remanent magnetization along the same direction. It is also possible to apply a magnetizing pulse during a measurement, in which case it may be convenient to match the polarities of the magnetizing pulse and of the measured field in order to sum the corresponding magnetomotive forces. The peak value of the magnetizing magnetomotive force can be reduced by an amount approximately equal to the measured magnetomotive force and the reduced peak value can be reached faster, allowing to shorten the duration of the magnetizing pulse. In the case of an overload, the measurement signal of the sensor arrangement would be interrupted by the overload and the magnetizing pulse may be applied during the overload and/or after the overload. The polarity of the magnetizing pulse can be matched to that of the overload, and the duration of the magnetizing pulse can be then drastically reduced. The measurement disruption after overload can be thus eliminated or minimized while removing hysteretic offset errors caused by the overload and ensuring optimum measurement accuracy.

According to a preferred embodiment, the pulse is applied to the core such that a remanent magnetization polarity of the core has a same polarity as a polarity of a magnetic field which is applied to the core after a calibration of the core. In many DC applications involving supply or generation of electrical energy, the primary current flows in one dominant direction. This is also the case in electrical vehicles and charging stations. In such applications, it is beneficial to align the preferred magnetized state of the ferromagnetic core in a direction along the dominant direction of the magnetic field created by the primary current. In this case, the magnetic flux density present in the ferromagnetic core during normal measurement operation would have the same direction as the preferred remanent magnetization. This means that the preferred remanent magnetization cannot drift towards a decreasing value as demagnetization of the ferromagnetic core is not possible. Because the preferred remanent magnetization is set by a magnetizing magnetomotive force which is larger than the normal operation magnetomotive force, the preferred remanent magnetization cannot drift towards an increasing value during normal operation. Even in the case of a strong overload, only weak drift of the preferred remanent magnetization may be possible because the magnetizing magnetomotive force is designed to approach or reach magnetic saturation. In applications where the current flows in one dominant direction, the remanent magnetization is very unlikely to drift and extremely low hysteretic offset error can easily be ensured.

According to a preferred embodiment, the method comprises providing a sensor arrangement comprising the core and the magnetic transducer in accordance with a physical quantity to be measured, wherein the physical quantity interacts via a magnetic field with the core and with the magnetic transducer; determining a correction quantity which represents the effect of the remanent magnetization in the core on the measurement signal; and storing the correction quantity. The correction quantity represents an offset. Multiple correction quantities related to various operation conditions and/or to other parameters of the sensor arrangement may be determined and stored.

According to a preferred embodiment, the calibration method comprises a step of generating a magnetizing pulse by using electronic or electrical circuitry to produce a current through a winding which is magnetically coupled to the core. Such a measure is simple and cost-efficient to realize.

According to a preferred embodiment, the method comprises providing a signal to indicate ongoing generation of magnetizing pulse.

According to a preferred embodiment, the core comprises a ferromagnetic material having a coercivity being lower than 3 A/m and a remanence ratio being lower than 0.2. The remanence ratio of the material is not the same as the remanence ratio of the core, where the remanence ratio of the core is also affected by the construction of the core, especially if the core is provided with an air gap.

According to a preferred embodiment, the transducer is a Hall transducer.

According to a preferred embodiment of the detecting method for a sensor arrangement comprising the core and the magnetic transducer, the sensor arrangement is provided with at least an electrical winding coupled to the core and with an electronic circuitry configured to apply an electrical signal to the electrical winding.

According to a preferred embodiment of the detecting method for a sensor arrangement comprising the core and the magnetic transducer, the electronic circuitry is configured to produce in a selectable manner an electrical magnetizing pulse for applying a pulse of magnetomotive force to the core according to any of the preferred embodiments and/or a compensation current for operating the sensor arrangement according to a flux compensation operation principle wherein the compensation current is proportional to the physical quantity to be measured.

According to a preferred embodiment of the detecting method for a sensor arrangement comprising the core and the magnetic transducer, a physical quantity, which is an electrical current flowing in a primary conductor and interacting via magnetic field with the core and the magnetic transducer, is measured.

According to a preferred embodiment of the detecting method for a sensor arrangement comprising the core and the magnetic transducer, the method comprises calibrating the core of the sensor arrangement according the method steps according to the invention or according to any of the preferred embodiments; and employing a supplementary sensor module, configured to measure the same physical quantity as the sensor arrangement, to provide a functional measuring signal while the core of the sensor arrangement is being calibrated.

According to a preferred embodiment, the detecting method comprises using a sensor arrangement operating according the calibration method, and a supplementary sensor module to deliver an enhanced measurement signal.

The supplementary sensor module measures the same physical quantity as the sensor arrangement and provides a supplementary measurement signal which is employed to replace the invalid measurement signal from the sensor arrangement during a calibration sequence, e.g. when a magnetizing pulse is being applied. In high performance applications, the supplementary sensor module may be similar or identical to the sensor arrangement. In cost and space conscious implementations, the supplementary sensor module may have a simpler construction than the sensor arrangement, being based for example on a magnetic transducer. If power consumption needs to be constrained, the supplementary sensor module may be maintained most of the time in a low energy mode and be activated when the preferred remanent magnetization needs to be reinitialized.

If the dynamic range needs to be extended, the supplementary sensor module may be designed to measure larger currents than the sensor arrangement and the supplementary measurement signal can be employed also when the sensor arrangement is overloaded. The approach has two straightforward benefits by providing a measurement signal featuring higher performance and not having to interrupt the measurement during calibration.

According to a preferred embodiment, the detecting method comprises employing electronic circuitry to process the signals from the supplementary sensor module and from the sensor arrangement for providing an enhanced measurement signal and achieving additional functionalities, such as signal correction and condition monitoring. For example, switches or a multiplexer may be employed to select between the two signals to provide an enhanced analog measurement signal, which may be further digitized and processed to obtain an enhanced digital measurement signal. Alternatively, it is possible to digitize the two signals and employ digital signal processing techniques to merge and to correct the signals for providing an enhanced digital measurement signal.

According to a preferred embodiment, the detecting method comprises measuring according to the flux compensation principle where the magnetic flux in the core is predominantly null during normal measurement operation. The remanent magnetization of the core would thus not change during normal operation allowing to preserve the preferred remanent magnetization in a very stable manner.

By the previously mentioned preferred method, one can improve the linearity of the sensor arrangement by operating the arrangement with a feedback loop to compensate the magnetic flux in the core or in part of the core. It is achieved by providing the sensor arrangement with means to apply a compensation magnetomotive force to the core which counteracts the magnetic flux to be sensed such that the total magnetic flux in the core is approximately 0. The compensation magnetomotive force is thus proportional to the magnetic field or to the magnetomotive force to be measured and the measurement signal can be conveniently derived from the compensation signal. The compensation is implemented by connecting the signal from the magnetic transducer to some electronic circuitry to apply a proportional current with high gain and negative feedback to a compensation winding which is magnetically coupled to the core. The compensation current is thus proportional to the magnetic field or to the magnetomotive force to be measured and the compensation current can be conveniently measured using a measurement resistor. The sensitivity of a flux-compensated sensor arrangement is thus mainly given by the feedback loop such that variations in the response of the core, transducer, and/or electronic circuitry have little impact on the output signal if the total open loop gain of the arrangement is sufficiently high. In the case of a flux-compensated current sensor the ratio between the compensation current and the primary current is equal to the ratio between the number of turns in the compensation winding and the primary winding.

According to a preferred embodiment, the detecting method comprises a step of producing a compensation magnetomotive force by employing electronic circuitry to condition the signal from the magnetic transducer and to apply a compensation current in a winding which is coupled to the core, and providing a measurement signal which is proportional to the compensation current.

According to a preferred embodiment of the detecting method, the compensation current and the magnetizing pulse current are produced using the same driver and winding, preferably in a sequential and controllable manner.

According to a preferred embodiment of the detecting method, a compensation magnetomotive force is applied by an electronic circuitry, to condition a signal from the magnetic transducer and to drive a compensation current in an electrical winding, wherein the electrical winding is coupled to the core such that a magnetic flux produced by a physical quantity to be sensed is at least partially cancelled and such that a total magnetic flux in the core is 0 during a normal measurement operation; a measurement signal which is proportional to the compensation current is provided; and a physical quantity, which is an electrical current flowing in a primary conductor and interacting via magnetic field with the core and the magnetic transducer, is measured. Preferably, the total magnetic flux in the core is approximately 0 during a normal measurement operation.

According to a preferred embodiment, the detecting method comprises combining a measurement of the physical quantity, preferably a current measurement, according to any of the preferred embodiments with a voltage measurement for measuring the electrical energy, or power, or other related quantity.

According to a preferred embodiment, the sensor arrangement is configured to detect a signal according to the detecting method according to the invention or any of the preferred embodiments.

According to a preferred embodiment, the sensor system is provided with means to execute a magnetization process for setting the preferred magnetized state. This would allow to reinitialize the preferred remanent magnetization in order to ensure that very low hysteretic offset error is consistently provided.

According to a preferred embodiment of the sensor system, the magnetizable core is provided with a gap and the magnetic transducer is located at least partly in the gap. The sensor system comprises a primary conductor provided to carry an electrical current which interacts via magnetic field with the magnetizable core and the magnetic transducer; and a processing circuitry configured to produce a measurement signal being proportional to the electrical current in the primary conductor, and to store a correction quantity which represents the effect of the remanent magnetization in the core on the measurement signal, and to correct the correction quantity, and to provide a corrected measurements signal.

According to a preferred embodiment, the sensor system comprises the calibration system according to the invention.

According to a preferred embodiment of the sensor system, the sensor system comprises at least an electrical winding coupled to the magnetizable core and an electronic circuitry connected to the electrical winding and to the magnetic transducer. The electronic circuitry is configured to produce a compensation current in the electrical winding, by a driver, which is proportional to the electrical current in the primary conductor according to a flux compensation operation principle.

According to a preferred embodiment of the sensor system, the compensation current is interruptible in a controllable manner in order to apply a magnetizing pulse.

According to a preferred embodiment of the sensor system, a supply circuit powers the driver with a power signal having a voltage value which is variable.

According to a preferred embodiment of the sensor calibration system, the system comprises a magnetic field source configured to apply a pulse of magnetomotive force to the core; and a control unit configured to correct a measurement signal by the quantity.

According to a preferred embodiment, the sensor calibration system comprises at least one electrical winding configured to carry out flux compensation and to magnetize the core and/or at least one driver configured to carry out flux compensation and to magnetize the core.

According to a preferred embodiment, the sensor calibration system further comprises a magnetic field source configured to apply a pulse of magnetomotive force to the core and a control unit configured to determine, by a quantity, a state of remanent magnetization in the core.

According to a preferred embodiment, the control unit is configured to correct the measurement signal by the quantity.

According to a preferred embodiment, it is not the same control unit which quantifies or determines a calibration quantity and corrects the measurement in accordance with this calibration quantity. For example, one control unit may be comprised by the calibration system and another control unit may be part of the sensor arrangement or sensor system or sensor calibration system.

Further embodiments and advantages of the method are directly and unambiguously derived by the person skilled in the art from the system as described before.

REFERENCE SIGNS LIST 1 magnetic transducer
2 signal conditioner
3 driver
4 resistor
5 magnetizing controller
6 selector
7 magnetiser driver
8 switching means
9 controller
10 driver
W1 primary winding
W2 secondary winding
W3 auxiliary winding
10 determining a change of state of a sensor arrangement
30 providing a measurement signal, by the sensor arrangement
40 determining a correction quantity
45 storing the correction quantity
50 selecting a polarity of the pulse of magnetomotive force to be applied to the core
70 storing the polarity of the pulse of magnetomotive force
100 applying a pulse of magnetomotive force to the core such that a distinct value of remanence is produced in the core, wherein the value of remanence in the core depends on a strength of the pulse
100a calibrating a core of a sensor arrangement
100A calibrating a core of a sensor arrangement
100b calibrating the core of the sensor arrangement
100B calibrating the core of the sensor arrangement
150A detecting, by a magnetic transducer coupled to a magnetizable core, a magnetic field
200A producing a measurement signal, by the sensor arrangement, in accordance with a physical quantity to be measured, wherein the physical quantity interacts via a magnetic field with the core and with the transducer
300A correcting the measurement signal by a correction quantity
350a detecting, by a magnetic transducer, a magnetic field and producing and correcting a measurement signal, by a sensor arrangement, in accordance with a physical quantity to be measured, wherein the physical quantity interacts via a magnetic field with the core and with the transducer 350A detecting, by a magnetic transducer, a magnetic field and producing and correcting a measurement signal, by a sensor arrangement, in accordance with a physical quantity to be measured, wherein the physical quantity interacts via a magnetic field with the core and with the transducer 400A providing a corrected measurement signal 500b employing a supplementary sensor module, configured to measure the same physical quantity as the sensor arrangement, to provide a functional measuring signal while the core of the sensor arrangement is being calibrated 600b employing an electronic circuitry to select and process the signals from the sensor arrangement and from the supplementary sensor module All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A detecting method for a sensor arrangement comprising a core and a magnetic transducer, comprising:
   configuring the core by a calibration method, the calibration method comprising:
   applying a pulse of magnetomotive force to the core to produce a distinct value of remanence in the core;
   wherein the value of remanence in the core depends on a strength of the pulse;
   detecting, by the magnetic transducer, a magnetic field;
   producing a measurement signal, by the sensor arrangement, in accordance with a physical quantity to be measured, wherein the physical quantity interacts via a magnetic field with the core and with the magnetic transducer;
   correcting the measurement signal by a correction quantity;
   wherein the sensor arrangement is provided with at least an electrical winding coupled to the core and with an electronic circuitry configured to apply an electrical signal to the electrical winding,
   wherein the electronic circuitry is configured to produce in a selectable manner an electrical magnetizing pulse for applying a pulse of magnetomotive force to the core and/or
   a compensation current for operating the sensor arrangement according to a flux compensation operation principle, wherein the compensation current is proportional to the physical quantity to be measured;
   wherein a physical quantity, which is an electrical current flowing in a primary conductor and interacting via magnetic field with the core and the magnetic transducer, is measured;
   employing a supplementary sensor module, configured to measure the same physical quantity as the sensor arrangement to provide a functional measuring signal while the core of the sensor arrangement is being calibrated; and
   employing an electronic circuitry to select and process the signals from the sensor arrangement and from the supplementary sensor module.

2. The calibration method according to claim 1, wherein a duration and the strength of the pulse produces a magnetization of the core induced by the pulse that is against a magnetic field with a strength below a magnetic field strength threshold, or wherein the duration and the strength of the pulse produces a magnetization of the core induced by the pulse with a remanent magnetization, which is larger than 50% of a saturation remanent magnetization of the core, or wherein the duration and the strength of the pulse produces a magnetization of the core induced by the pulse with a remanent magnetization, which is larger than 80% of a saturation remanent magnetization of the core.

3. The calibration method according to claim 1, wherein the duration of the pulse matches or exceeds a critical time to reach a desired peak value of the magnetizing magnetomotive force, or wherein the duration of the pulse is in a range from 0.01 ms to 200 ms.

4. The calibration method according to claim 1, wherein the pulse is applied to the core after a change of a state of a sensor arrangement comprising the core and the magnetic transducer is determined, and/or wherein the change of the state is given by a power-up of the sensor arrangement and/or is indicated by a state signal, and/or wherein the state signal indicates a status of a charging session of a vehicle charging station.

5. The calibration method according to claim 1, further comprising selecting a polarity of the pulse of magnetomotive force to be applied to the core and storing the polarity of the pulse of magnetomotive force.

6. The calibration method according to claim 1, further comprising:
providing a sensor arrangement comprising the core and the magnetic transducer in accordance with a physical quantity to be measured, wherein the physical quantity interacts via a magnetic field with the core and with the magnetic transducer;
determining a correction quantity which represents the effect of the remanent magnetization in the core on the measurement signal; and
storing the correction quantity.

7. A sensor system, comprising:
a magnetizable core, wherein the magnetizable core is coupled to a magnetic transducer;
wherein a calibration process includes applying a pulse of magnetomotive force to the core to produce a distinct value of remanence in the core, and wherein the value of remanence in the core depends on a strength of the pulse;
wherein the magnetizable core is provided with a gap and the magnetic transducer is located at least partly in the gap,
wherein the sensor system further includes:
a primary conductor configured to carry an electrical current which interacts via magnetic field with the magnetizable core and the magnetic transducer; and
a processing circuitry configured
to produce a measurement signal being proportional to the electrical current in the primary conductor,
to store a correction quantity which represents effect of remanent magnetization in the core on the measurement signal,
to correct a correction quantity, and
to provide a corrected measurements signal; and
at least one electrical winding coupled to the magnetizable core and an electronic circuitry connected to the electrical winding and to the magnetic transducer,
wherein the electronic circuitry is configured to produce a compensation current in the electrical winding, by a driver, which is proportional to the electrical current in the primary conductor according to a flux compensation operation principle,
wherein the compensation current is interruptible in a controllable manner to apply a magnetizing pulse, and
wherein a supply circuit powers the driver with a power signal having a voltage value which is variable.

8. The sensor system of claim 7, further comprising:
a magnetic field source configured to apply a pulse of magnetomotive force to the core;
a control unit configured to determine a state of remanent magnetization in the core, wherein the control unit is configured to correct a measurement signal by the quantity,
wherein the sensor calibration system includes at least one electrical winding configured to carry out flux compensation and/or at least one driver configured to carry out flux compensation and to magnetize.

* * * * *